Figure 1:
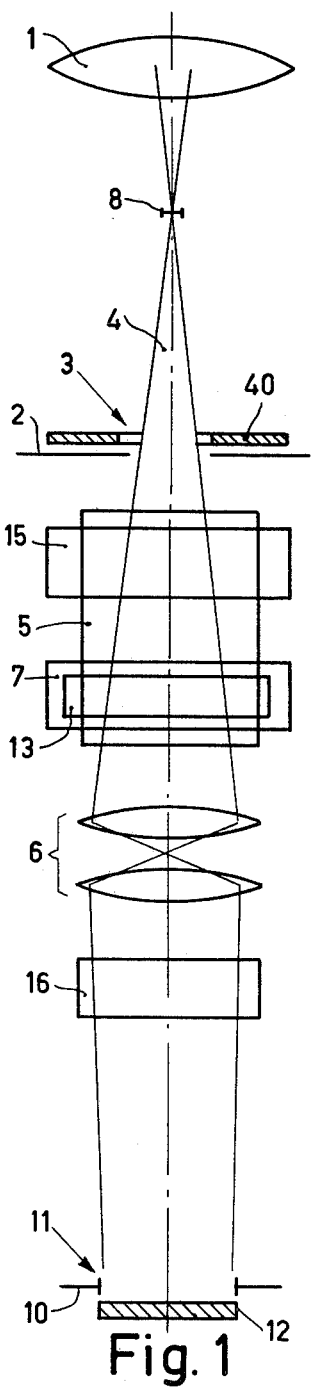

United States Patent [19]
Andersen

[11] 3,979,590
[45] Sept. 7, 1976

[54] ELECTRON MICROSCOPE COMPRISING AN ENERGY ANALYZER

[75] Inventor: Willem Hendrik Jan Andersen, Eindhoven, Netherlands

[73] Assignee: U.S. Philips Corporation, New York, N.Y.

[22] Filed: Mar. 28, 1975

[21] Appl. No.: 562,965

[30] Foreign Application Priority Data
Apr. 1, 1974 Netherlands.................... 7404363

[52] U.S. Cl................................ 250/305; 250/311
[51] Int. Cl.².......................................... H01J 37/26
[58] Field of Search ........... 260/305, 306, 307, 310, 260/311, 309

[56] References Cited
UNITED STATES PATENTS
3,256,433  6/1966  Watanabe.......................... 250/305

FOREIGN PATENTS OR APPLICATIONS
1,364,930  8/1974  United Kingdom................. 250/305

OTHER PUBLICATIONS
"Microanalysis by Electron Energy Analysis with a Cylindrical Magnetic Lens", Ichenokawa, Vth International Congress on X-Ray Optics and Microanalysis, Sept. 1968, pp. 299–304.

Primary Examiner—Craig E. Church
Attorney, Agent, or Firm—Frank R. Trifari; George B. Berka

[57] ABSTRACT

A Wien filter, used as an energy analyzer in an electron microscope, includes a four-pole lens which enlarges the dispersion of electrons in one direction. By addition of six-pole lenses and an additional four-pole lens, correction can be made for opening errors in the electron beam to be analyzed.

5 Claims, 5 Drawing Figures

ELECTRON MICROSCOPE COMPRISING AN ENERGY ANALYZER

The invention relates to an electron microscope comprising an electron source of increased emission density, an electron-optical lens system, an energy analyser, and an electron detector.

An electron microscope of this kind is known, for example, from Journal of Applied Physics, Volume 39, No. 13, pages 5861 – 5868, Crewe et al. In the arrangement described therein, an electrostatic analyser is used for the energy analysis. Consequently, the system does not work in a straight view mode, is poorly adjustable, and at adequate resolution in the energy analysis the transmission of the arrangement is strongly restricted.

The invention has for its object to provide an electron microscope in which the straight view of the electron-optical system is maintained and whereby the energy analysis can be performed with greater accuracy and high transmission. To this end, and electron microscope of the kind set forth according to the invention is characterized in that the energy analyser is composed of a Wien filter having associated therewith a four-pole lens system for enlarging an image in the dispersion direction, and a beam-deflection device for the displacement of the said image in the dispersion direction over a gap which is situated in an image plane of the analyser, and behind which the electron detector is situated. In a field space in an active Wien filter a homogeneous magnetic field and a homogeneous electrostatic field prevail, the said fields of force being directed perpendicular to each other and both transverse to a principal direction for an electron beam to be analysed which passes through the field space. In the field space the electrons are subjected to two mutually opposed forces which just cancel each other for an adjustable nominal electron velocity ($V_o$), but which produce a deflecting resultant acting on the electrons in the case of deviating electron velocities.

It is to be noted that the use of a Wien filter in an electron microscope is known per se (see, for example, British Patent Specication No. 1,364,930). The Wien filter used therein, however, has a different function: An imaging field of the electron microscope acts as an object therein, and the electron beam must be decelerated during passage of the Wien filter so as to achieve adequate resolution.

An embodiment according to the invention will be described in detail hereinafter with reference to the drawing.

Figure 2:
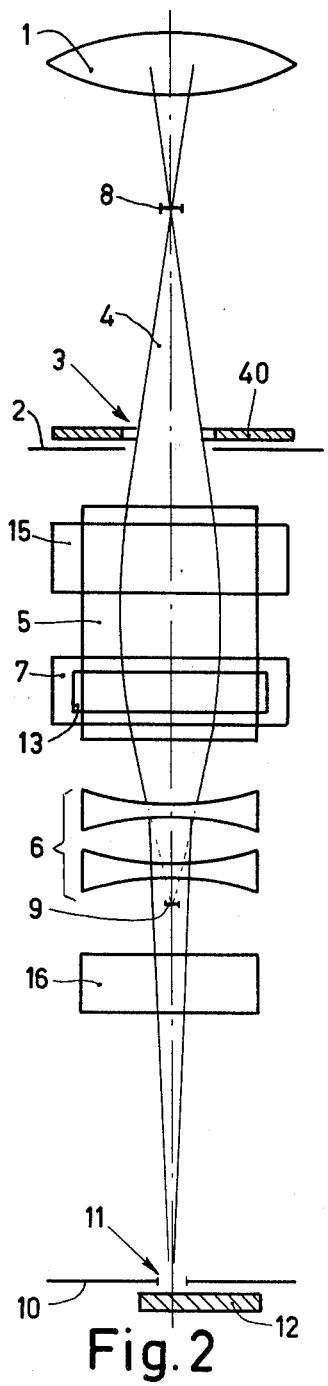
Figure 3:
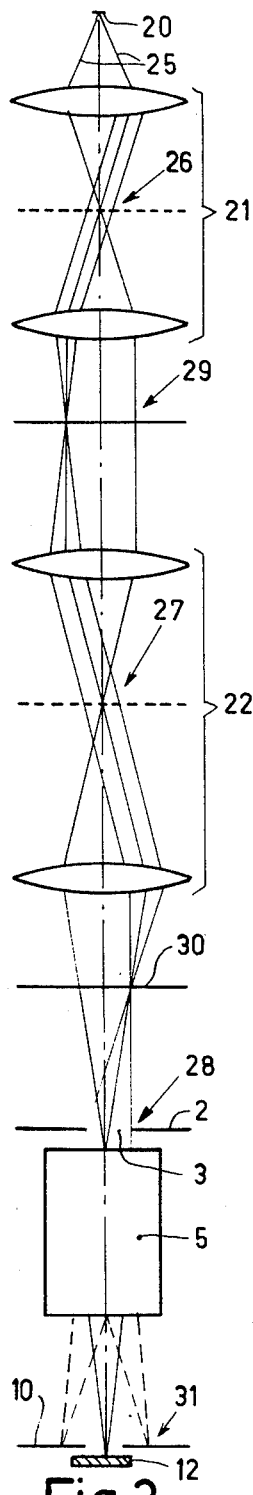
Figure 4:
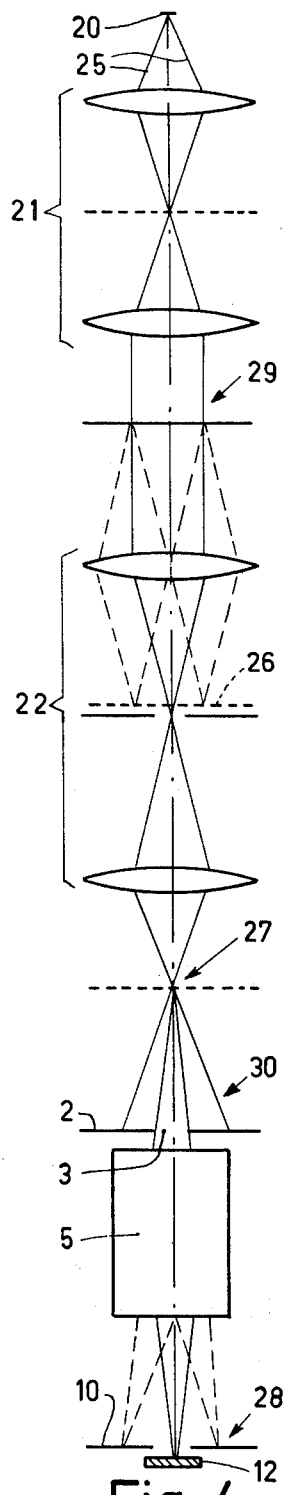
Figure 5:
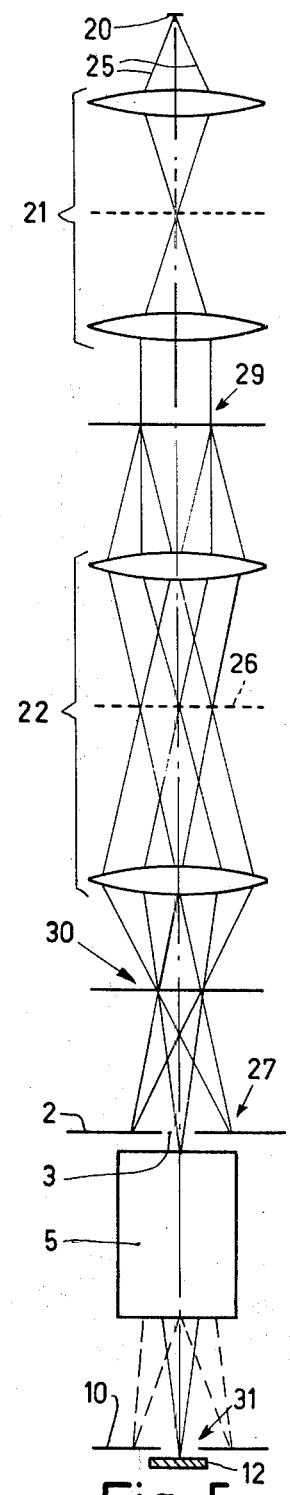

FIG. 1 is a diagrammatic representation of a preferred embodiment of an electron energy analyser with a beam path viewed in an X-direction, FIG. 2 shows the preferred embodiment of FIG. 1, but viewed in an Y-direction transverse to the X-direction, and FIGS. 3–5 show the beam path in an electron microscope comprising an energy analyser according to the invention for different settings of the electron microscope.

FIG. 1 shows, viewed in a beam section in an X-direction which coincides with a dispersion direction of the analyser of an electron microscope, a projector lens 1, and a target screen 2 having an opening 3. Viewed in the movement direction of an electron beam 4, the target screen 2 is followed by an energy analyser in this electron microscope, which may be a transmission electron microscope (TEM) as well as a scanning electron microscope (SEM) or a combination (STEM) of both types of electron microscope, and which is preferably provided with a field-emission electron source. The energy analyser comprises a Wien filter 5 which is composed of electromagnetic and electrostatic elements which are not separately shown. A Wien filter of this kind is generally known and is described, for example, in British Journal of Applied Physics, Volume 18, pages 1573–1579. The Wien-filter 5 is supplemented by a four-pole lens 6 and a deflection element 7. The four-pole lens as well as the deflection element are known per se. An electromagnetic coil is preferably used as the deflection element in this case. The deflection element can alternatively be realized by incorporating an adjustable unbalance in the Wien filter, so that a defelection in a direction to be chosen remains as a resultant. Because the maximum deflection angle is only small, for example, only a few arc minutes, no disturbing errors are introduced when a simple coil is used either. From a narrowest cross-over 8 in the electron beam, the Wien filter forms a spectrum 9 having a dispersion situated in the X-direction. This dispersion spectrum is imaged on an output screen 10 by the four-pole lens, the spectrum being enlarged in the dispersion direction, for example, 20 to 100 times. As a result, the resolution of the analyser in the output screen is increased. The output screen 10 is provided with a slot 11 whose width direction coincides with the dispersion direction, and whose longitudinal direction coincides with the Y-direction (FIG. 2). In the Y-direction, i.e. transverse to the dispersion direction, the four-pole lens 6 does not enlarge or only to a much smaller extent. As a result, the current density in the image of the analyser can be very strongly increased, which results in a high transmission of the analyser. Using this enlargement, the length of the line image can also be adjusted, and hence be adapted to the slot length. The slot 11 has a width which is adjustable, for example, between 0.1 and 10 mm, and a length of from 5 to 10 mm. Any desired construction can be chosen for the slot, for example, as shown in FIG. 3 of the said article in Journal of Applied Physics. Behind the slot 11 there is arranged an electron detector 12. This detector is preferably a semiconductor detector, for example, as used in the SEM attachment marketed by Applicant. The electronics required for the detection can be chosen in accordance with this construction.

Using the deflection element, the line image is moved over the slot in the dispersion direction, so that energy analysis can be realized. In practical cases the line image is moved over the slot over a distance corresponding to, for example, 100 eV, and measuring can be done with an accuracy of approximately 2 eV.

The figures also show a few electron-optical aids which, because of their straight optical axis, usually cannot be used in analysis systems having a curved axis, i.e. the already said systems without direct-vision. For example, on the output side of the Wien filter a comparatively weak four pole lens 13 is arranged. By means of this lens, the focussing of the Wien filter can be adapted to the position of the cross-over in the electron microscope, without the energy selection setting being affected thereby. The energy spectrum can thus remain focussed on the output screen for varying positions of the crossover which acts as the object the for Wien filter. For the four-pole lens the dispersion image is virtually as shown in FIG. 1. Using a six-pole 15, arranged over the Wien filter, second-order opening errors, notably in the dispersion direction, can be corrected if necessitated by the opening angle of the incoming beam. Using a six-pole 16, arranged on the exit side of the Wien filter, line curvature can be corrected for. These correction facilities are very important, because correction of beam opening errors and line curvature enables optimum adaptation to the selection slot in the output face. For a given energy-separating power, the transmission of the system then increases, in other words the collection efficiency of the system increases. The six-poles to be used are electron-optical elements which are known per se. The property of these lenses, i.e. the fact that correction can be effected in one direction without a de-correction effect in the other direction, is particularly advantageous. The deflection system 7 can have a double construction in a sense that mutually perpendicular fields of force, to be independently controlled, can be applied. For the said displacement of the image over the slot, this field of force has the same direction as the corresponding main field of the Wien filter. The field of force for the centering of the line image in the longitudinal direction of the slot is directed transverse to the corresponding main field of the Wien filter.

The object for the analyser is determined by the cross-over after the last lens of the electron microscope and the beam opening for the analyser is determined by the diaphragm 3 in the target screen 2 of the electron microscope. If an electron microscope operates in the STEM mode, the cross-over 8 is determined, as is also shown in FIG. 3, by the dimension of the scanned portion of the object, and the opening angle is determined by the opening angle of the scanning electron beam relative to the target screen. In this situation the dimension of the cross-over is, for example, a few micrometers, and a favourable value for the diaphragm opening 3 is, for example, between 0.5 and 2.0 mm. By adaptation of the excitation of the projector lens, optimum adjustment between the cross-over and the beam opening for the analyser can be achieved. In the case of a TEM, two possibilities exist, i.e. the imaging setting and the diffraction setting; see for example FIGS. 4 and 5. For the diffraction setting, the cross-over 8 is determined by the size of the region of the object determined by a selected area diaphragm situated in the diffraction lens of the electron microscope. The diaphragm 3 can then have an opening of, for example, 0.05 to 2 mm. This diaphragm opening is then determined by the desired resolution of the analyser, and the said diffraction image. For the imaging setting, the cross-over is determined by the image of an objective diaphragm in the electron microscope, and the diaphragm 3 can be adapted again to the desired image resolution for the above selection area of the object. The energy resolution of the analyser can then also be adapted to the desired resolution.

The energy analyser itself can also operate in two different modes, i.e. for energy selection where one image moves from the electron microscope over the input of the analyser and where one band of the entire energy spectrum is measured. Across the entire image, the part of the electrons which has been subjected to a given deceleration, for example, of between 40 and 50 eV, in the specimen is thus registered. For the scanning setting a spectrum of a selected area of the microscope image is registered, the electron deceleration occurring in the specimen then appearing as a variable. The measured result is then a curve which represents the number of electrons within a velocity range as a function of the electron velocity.

In the arrangement for measuring STEM energy selection, a comparatively large entrance diaphragm for the analyser is required. Therefore, the said six-pole corrections are necessary notably in this arrangement. A practical energy analyser will have a length of, for example, approximately 30 cm, and at an output voltage of 100 KeV a resolution of approximately 1 eV can be achieved. The final voltage of the electron microscope may vary between 10 KeV and 150 KeV. The cross-over in the electron microscope, acting as the object for the analyser, has a transverse dimension of at the most 5 microns and is suited, for example, approximately 25 cm in front of the target screen. At a magnification of 100 times of the four-pole lens, the dispersion in the end face amounts to approximately 10 eV per mm. Measuring takes place over a range of, for example, 100 eV, which means between a delay 0, i.e. the electrons passing undisturbed, and the electrons decelerated by 100 eV in the specimen.

The FIGS. 3–5 show an electron source 20, an illumination system 21, an imaging system 22, and the target screen 2 already shown in the FIGS. 1 and 2 in different settings of an electron microscope. The target screen comprises the diaphragm 3, behind which the described Wien filter system 5 with the output screen 10 and the electron detector 12 is arranged. An electron beam 25 departing from electron source 20 constitutes a collection point or set of collection points 26, an intermediate image 27 and a final image 28 being formed therefrom. An intermediate image 30 and a final image 31 of an object 29 are also formed. The difference between the different settings of the electron microscope for the analyser then consists in the position and the nature of the said collection points with the images thereof and the image of the object.

In the STEM setting, as shown in FIG. 3, the illumination system comprises a beam deflection device which is not shown in detail and which is known as a wobbler device. This is used to form the collection point 26. This point, therefore, consists of a circle about the axis wherethrough the electron beam successively passes in time at a varying angle. A final image 28 thereof is situated on the target screen 2. An image 30 of the object 29 constitutes the object 8 for the analyser, and this image 30 is thus imaged in the output screen 10.

In a TEM setting for imaging as shown in FIG. 4, however, the image 27 of the collection point 26 constitutes the object 8 for the analyser, the image 30 of the object coinciding with the target screen 2, the second image 28 of the collection point coinciding with the output screen 10.

In a TEM diffraction setting, a first image 30 of the object constitutes the object 8 for the analyser. A first image 27 of the collection point 26, in this case the diffraction pattern, then coincides with the target screen 2, and the image 31 of the object coincides with the output screen 10. For composite measurements, an electron detector 40 is situated on the screen 2.

What is claimed is:

1. An electron microscope comprising an electron source, electron-optical lens system to form an electron beam having a cross-over section, a dispersing energy analyzer including a Wien filter for which the cross-over section acts as an object, said filter being operable for dispersing in a transverse direction with respect to the axial direction of the beam the electrons having velocities deviating from a preselected velocity; a four-pole lens system located at the output of said filter to increase the dispersion in said transverse direction, deflection means for moving the beam in said transverse direction, an output screen located in an image plane and having an elongate slot extending in said transverse direction, and an electron detector located behind the slot.

2. An electron microscope as claimed in claim 1, wherein a six-pole lens correction system is arranged between the four-pole lens system and the output screen, for correcting second-order beam opening errors of the analyser.

3. An electron microscope as claimed in claim 1, wherein the analyser has an additional four-pole lens for an independent correction of errors in the imaging due to a deviating energy selection setting of the energy analyser.

4. An electron microscope as claimed in claim 1, further comprising an additional deflection device for moving the beam in a direction perpendicular to the longitudinal dimension of said slot.

5. An electron microscope as claimed in claim 1, further including an intermediate image screen which acts as an entrance pupil for the analyser and has a passage opening in the range of approximately 0.05 to 2 mm.

* * * * *